(12) United States Patent
Fukaya et al.

(10) Patent No.: US 10,120,274 B2
(45) Date of Patent: Nov. 6, 2018

(54) METHOD OF MANUFACTURING PHOTOMASK BLANK AND PHOTOMASK BLANK

(71) Applicant: Shin-Etsu Chemical Co., Ltd., Tokyo (JP)

(72) Inventors: Souichi Fukaya, Niigata (JP); Yukio Inazuki, Niigata (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 64 days.

(21) Appl. No.: 15/404,755

(22) Filed: Jan. 12, 2017

(65) Prior Publication Data

US 2017/0123306 A1 May 4, 2017

Related U.S. Application Data

(63) Continuation of application No. 14/306,670, filed on Jun. 17, 2014, now Pat. No. 9,581,892.

(30) Foreign Application Priority Data

Jul. 3, 2013 (JP) .................................. 2013-139814

(51) Int. Cl.
 *G03F 1/32* (2012.01)
 *G03F 1/26* (2012.01)
(52) U.S. Cl.
 CPC . *G03F 1/32* (2013.01); *G03F 1/26* (2013.01)
(58) Field of Classification Search
 CPC .................................... G03F 1/26; G03F 1/32
 USPC ............................................................ 430/5
 See application file for complete search history.

(56) References Cited

U.S. PATENT DOCUMENTS

| 5,629,114 | A | 5/1997 | Isao et al. |
| 6,599,667 | B2 | 7/2003 | Yusa et al. |
| 7,195,846 | B2 | 3/2007 | Kaneko et al. |
| 9,310,685 | B2 | 4/2016 | Bessonov |
| 2002/0098422 | A1 | 7/2002 | Nozawa |
| 2005/0260505 | A1 | 11/2005 | Fukushima et al. |
| 2007/0092807 | A1 | 4/2007 | Fukushima et al. |
| 2008/0076040 | A1 | 3/2008 | Fukushima et al. |
| 2010/0167185 | A1 | 7/2010 | Suzuki et al. |
| 2010/0246932 | A1 | 9/2010 | Inazuki et al. |

FOREIGN PATENT DOCUMENTS

| EP | 1 777 588 A2 | 4/2007 |
| EP | 2 237 109 A2 | 10/2010 |
| JP | 07-140635 A | 6/1995 |
| JP | 09-244212 A | 9/1997 |
| JP | 2001-312043 A | 11/2001 |
| JP | 2002-229183 | 8/2002 |
| JP | 2004-199035 A | 7/2004 |
| JP | 2005-331554 | 12/2005 |
| JP | 2007-114680 | 5/2007 |
| JP | 2007-114681 A | 5/2007 |
| JP | 2008-76994 | 4/2008 |
| JP | 2010-156880 | 7/2010 |
| JP | 2010-237501 | 10/2010 |
| JP | 2011-2639 | 1/2011 |
| JP | 2012-252052 A | 12/2012 |

OTHER PUBLICATIONS

Extended European Search Report dated Nov. 28, 2014 in the corresponding European Application No. 14175323.6.
Office Action dated Sep. 15, 2015 in Japanese Patent Application No. 2013-139814.

*Primary Examiner* — Christopher G Young
(74) *Attorney, Agent, or Firm* — Oblon, McClelland, Maier & Neustadt, L.L.P.

(57) ABSTRACT

In a chamber (50), a quartz substrate (10) having a main surface on which an optical film (20) is formed is put on a susceptor (30). A flash lamp (60) is housed in a lamp house (90), and the optical film (20) is irradiated with flash light through two quartz plates (70a and 70b). A transmittance adjustment region (80) is formed on a surface of the quartz plate (70b) of the two quartz plates (70a and 70b), and the amount of light with which the optical film (20) is irradiated has in-plane distribution. If the optical film (20) is irradiated with the flash light, optical characteristics of the optical film (20) change depending on the received irradiation energy. Hence, for example, the characteristics of the optical film are not uniform, the optical film is irradiated with flash light having such irradiation energy distribution that cancels the in-plane distribution.

17 Claims, 8 Drawing Sheets

METHOD OF MANUFACTURING PHOTOMASK BLANK AND PHOTOMASK BLANK

CROSS REFERENCE TO RELATED APPLICATIONS

This application is a continuation of U.S. patent application Ser. No. 14/306,670, filed on Jun. 17, 2014, and claims priority to Japanese Patent Application No. 2013-139814, filed on Jul. 3, 2013.

BACKGROUND OF THE INVENTION

Field of the Invention

The present invention relates to a technique for enhancing the in-plane uniformity of optical characteristics of an optical film formed in a photomask blank.

Description of the Related Art

Along with higher integration of semiconductor integrated circuits, further refinement and higher precision are required for patterns formed on photomasks. Consequently, for the reason of an enhancement in resolution, exposure light having a shorter wavelength is increasingly used for a photolithography technique. Specifically, the used exposure light is being shifted from g rays (a wavelength $\lambda=436$ nm) and i rays ($\lambda=365$ nm), which are emitted from ultraviolet light sources, to KrF rays ($\lambda=248$ nm) and ArF rays ($\lambda=193$ nm), which are emitted from far-ultraviolet light sources.

Further, in order to achieve such further refinement and higher precision of patterns, liquid immersion technology, resolution enhancement technology (RET), and technology such as double exposure (double patterning lithography) are also applied.

Meanwhile, as the wavelength of exposure light is shorter, the depth of focus (DOF) is narrower. Hence, a focus error is more likely to occur at the time of pattern transfer, and this causes a decrease in manufacture yield.

One of the methods of improving such a depth of focus is a phase shift method. According to the phase shift method, patterns are formed using a phase shift mask such that the phases of patterns adjacent to each other are different by approximately 180°. According to the phase shift method, light that has passed through a region in which a phase shift film is formed and light that has passed through a region in which a phase shift film does not exist interfere with each other in a boundary portion therebetween, and the obtained light intensity distribution exhibits a sudden change in the boundary portion, so that the image contrast is enhanced. Note that the phase shift mask includes masks of Levenson type and halftone type.

A phase shift mask including a phase shift film made of molybdenum silicide oxide (MoSiO) or molybdenum silicide oxide nitride (MoSiON) has been proposed as the halftone phase shift mask (see, for example, Japanese Patent Laid-Open No. 7-140635). Further, a phase shift film containing chromium and a phase shift film containing tantalum have also been proposed as the halftone phase shift mask (Japanese Patent Laid-Open Nos. 9-244212 and 2001-312043).

Such a phase shift mask is formed by pattern-forming a phase shift mask blank according to a lithography method. For example, in the case of the halftone phase shift mask, a photomask blank obtained by forming a halftone phase shift film and a light shielding film (such as a Cr film) in order on a transparent substrate is used.

A resist is applied onto this photomask blank, and a desired portion of the resist is exposed to electron rays or ultraviolet rays and is then developed, whereby the resist is patterned. Then, the light shielding film and the phase shift film are removed by etching using the patterned resist film as a mask. Then, if the resist film and the light shielding film are peeled off, the halftone phase shift mask is obtained as a result.

Note that a plurality of photomasks are used to manufacture a device having a structure in which a plurality of layers are laminated, and superimposition with high precision is required in this case. Further, double patterning, which is a new technique of performing exposure to light with a layout being divided into two (or more) photomasks, is required to achieve superimposition with still higher precision.

In the case where a thin film formed on a substrate is already stressed in a photomask blank state, unfortunately, the film stress is partially released in the respective steps of resist application, exposure to light, development, etching, and resist peel-off for pattern formation, and the finally obtained photomask itself is "distorted". Such distortion makes the precision of photomask superimposition lower, and causes defects.

The level of such "distortion" depends on a formed pattern and the magnitude of a film stress, and it is extremely difficult to control the level of such "distortion" during a photomask manufacturing process.

If each thin film is formed under such conditions that can make the stress in the thin film approximately zero, this problem does not occur, but it is extremely difficult and practically impossible to find manufacturing process conditions that can satisfy both: film formation conditions for securing characteristics to be provided to the thin film as an optical film; and conditions for forming a low-stress thin film. For this reason, it is necessary to provide, as different independent steps, a step of forming the thin film under conditions that can secure the characteristics of the thin film and a step of reducing the stress in the thin film.

In general, a thin film such as a phase shift film in a photomask blank is formed according to a sputtering method. A stress is generated in the thin film in the course of the film formation process, and this stress distorts the substrate itself, and warps the photomask blank.

The following technique has been proposed as a solution to this problem. That is, the film stress is controlled by irradiating the light absorbing thin film such as a phase shift film with light from a flash lamp at a predetermined energy density, whereby the warpage of the photomask blank is reduced (Japanese Patent Laid-Open No. 2004-199035).

It is considered that, if a light absorbing film such as a halftone phase shift film is irradiated with flash light, absorption of the irradiation light, a rapid change in temperature, and the like change the film composition, the atom bonding state, and the like, to thereby change optical characteristics of the film and relieve the film stress.

A hot plate, a heater, a halogen lamp, an infrared lamp, and a furnace are conceivable as means for externally imparting energy for stress relief of a thin film. According to these means, the substrate itself is damaged by an increase in substrate temperature caused by imparting the energy, and the productivity is decreased by an increase in processing time. Hence, such light irradiation using a flash lamp as described in Japanese Patent Laid-Open No. 2004-199035 is superior.

Although the stress is improved by light irradiation using a flash lamp, the amount of absorbed light is different between a peripheral region and a central region of an optical film formed on a substrate to be irradiated, depending on the structure of a flash lamp irradiation apparatus and the shape of the substrate, so that optical characteristics of the optical film fluctuate in the same plane. A technique for improving this is disclosed in Japanese Patent Laid-Open No. 2007-114681.

A roadmap concerning lithography of ITRS in 2011, however, requires the in-plane uniformity of optical film characteristics to be higher.

The present invention, which has been made in view of such a requirement, has an object to provide a technology of further enhancing the in-plane uniformity of optical characteristics of an optical film, particularly, a halftone phase shift film formed in a blank (photomask blank) used for manufacturing a photomask.

SUMMARY OF THE INVENTION

In order to achieve the above-mentioned object, a method of manufacturing a photomask blank according to the present invention includes: a first step of forming an optical film on a quartz substrate transparent to exposure light; and a second step of irradiating the optical film with flash lamp light. The optical film is irradiated with the flash lamp light through a quartz plate on which a region with a different transmittance to the flash lamp light is formed.

For example, the quartz plate includes a light shielding film on a surface thereof, and the light shielding film has a thickness that is different correspondingly to the region with a different transmittance.

In this case, the second step may include a sub-step of forming the light shielding film having the thickness that is different correspondingly to the region with a different transmittance, on a transparent quartz plate, by: forming a light shielding film on an entire surface of a second quartz plate; then irradiating the second quartz plate with flash light having in-plane intensity distribution; and sublimating the light shielding film in accordance with irradiation intensity of the flash light, to thereby deposit the sublimated light shielding film onto the transparent quartz plate.

Note that, after the formation of the quartz plate, the optical film is irradiated with the flash lamp light using the formed quartz plate, and hence the sub-step is unnecessary.

Further, the quartz plate may be formed by: irradiating a substrate on which a light shielding film is formed, with flash light; and sublimating the light shielding film, to thereby deposit the sublimated light shielding film onto a transparent quartz plate.

Further, for example, the quartz plate has a surface roughness that is different correspondingly to the region with a different transmittance.

The method of manufacturing a photomask blank may further include a third step of laminating one or more films on the optical film after the flash lamp light irradiation.

Moreover, the one or more films are selected from other optical films different from the optical film and functional films.

The optical film is, for example, a halftone phase shift film.

The other optical films are, for example, a light shielding film and an antireflective film.

The functional films are, for example, an etching stopper film and an etching mask film.

Note that each functional film may be provided with characteristics as an optical film, and, in this case, the characteristics of the functional film need to be adjusted in consideration of a balance with the optical film having the same characteristics.

A photomask blank according to the present invention is manufactured using the above-mentioned method.

According to the present invention, it is possible to further enhance the in-plane uniformity of optical characteristics of an optical film constituting a photomask blank used for manufacturing a photomask.

DETAILED DESCRIPTION OF THE PREFERRED EMBODIMENTS

Hereinafter, an embodiment of the present invention is described with reference to the drawings.

Figure 1:
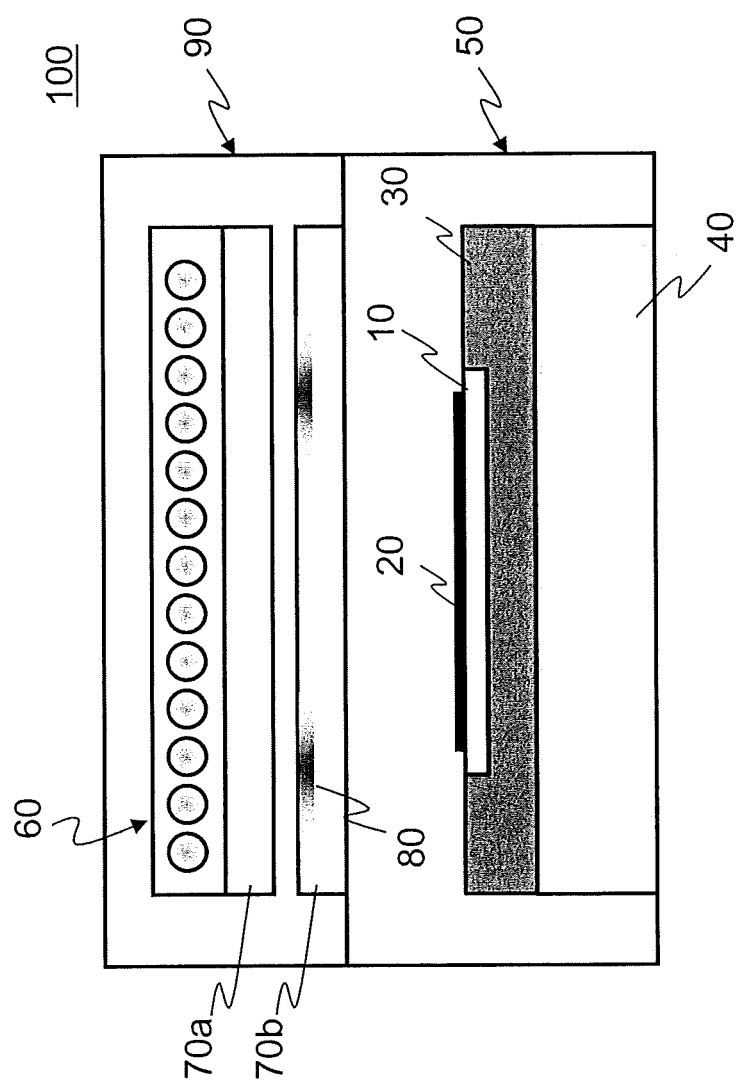
FIG. 1 is a schematic view for describing a configuration example of a flash light irradiation apparatus used in the present invention.

FIG. 1 is a schematic view for describing a configuration example of a flash light irradiation apparatus 100 used in the present invention.

In a chamber 50, a quartz substrate 10 having a main surface on which an optical film 20 is formed is put on a susceptor 30. The susceptor 30 can be heated by a heater 40 provided therebelow.

A flash lamp 60 such as a xenon lamp is housed in a lamp house 90. In an example illustrated in FIG. 1, the optical film 20 is irradiated with flash light through two quartz plates 70a and 70b. A region (transmittance adjustment region) 80 with a different transmittance to the flash lamp light is formed on a surface of the quartz plate 70b of the two quartz plates 70a and 70b. Note that the lamp house 90 is hermetically sealed to prevent contaminations from its surroundings.

Further, in the chamber 50, an atmosphere when the optical film 20 formed on the quartz substrate 10 transparent to exposure light is subjected to the flash light irradiation process is optimized. The inside of the chamber 50 is, for example, under atmospheric pressure, under nitrogen atmosphere, under atmosphere obtained by adding oxygen to nitrogen in control, or under vacuum atmosphere.

In the case where the inside of the chamber 50 is under atmospheric pressure or under atmosphere obtained by adding oxygen to nitrogen in control, a surface of the optical film 20 is oxidized during the flash light irradiation process. As a result, the resistance of the optical film 20 to chemicals is enhanced.

On the other hand, in the case where the inside of the chamber 50 is under nitrogen atmosphere or under vacuum atmosphere, the surface of the optical film 20 is not oxidized during the flash light irradiation process. As a result, control of optical characteristics of the optical film 20 is facilitated.

From the perspective of manufacturing a defect-free photomask blank, it is preferable that the inside of the chamber 50 be under vacuum atmosphere. This is because, if the inside of the chamber 50 is under vacuum atmosphere, impacts due to gas expansion in the chamber 50 do not occur, and there is no concern about generation of particles and stirring up of deposited particles in the chamber 50.

In the present invention, the flash light irradiation apparatus 100 configured as described above is used to irradiate the optical film 20 with flash light. Because the optical film 20 is irradiated with the flash lamp light through the quartz plate 70b on which the region 80 with a different transmittance to the flash lamp light is formed, the amount of light with which the optical film 20 is irradiated has in-plane distribution.

If the optical film 20 is irradiated with the flash light, the optical characteristics of the optical film 20 change depending on the received irradiation energy. Hence, in the case where the optical film after the film formation is not uniform in the same plane but has in-plane distribution, the optical film is irradiated with flash light having such irradiation energy distribution that cancels the in-plane distribution, whereby the in-plane uniformity of the characteristics of the optical film can be enhanced.

Figure 2C:
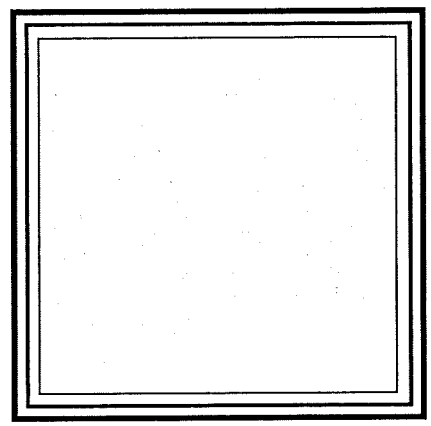
FIGS. 2A-C are views for conceptually describing that in-plane uniformization of optical characteristics of an optical film is achieved by flash light irradiation.
Figure 2B:
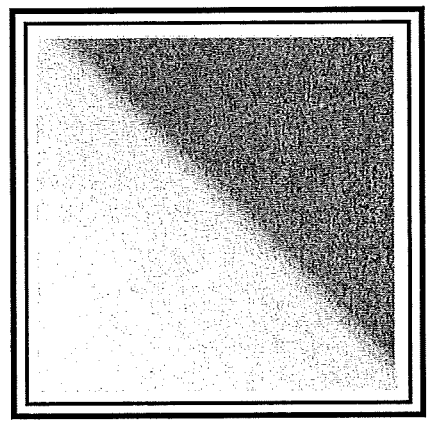
Figure 2A:
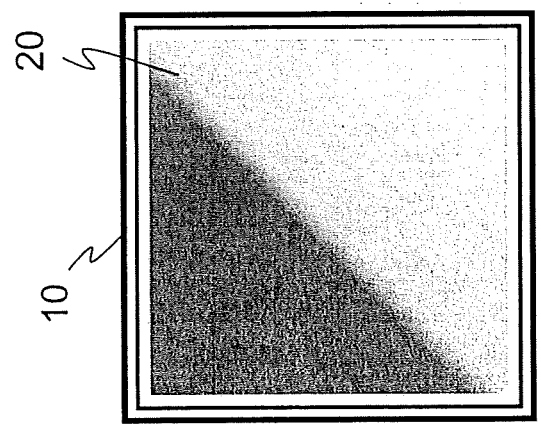

FIGS. 2A-C are views for conceptually describing that in-plane uniformization of the optical characteristics of the optical film 20 is achieved by the flash light irradiation.

FIG. 2A conceptually illustrates a state of distribution of the optical characteristics (here, the amount of phase shift to exposure light) of the optical film 20 after the film formation, in which measurement values after the optical film formation are mapped and the amount of phase shift becomes smaller from top left toward bottom right.

In the case where the amount of phase shift is increased by the flash light irradiation, the optical film 20 may be irradiated with flash light under such conditions that the amount of irradiation becomes larger from top left toward bottom right, in order to make the distribution of the optical characteristics uniform in the same plane.

FIG. 2B conceptually illustrates a state of distribution of the amount of flash light irradiation on the optical film 20 under the above-mentioned conditions, in which the amount of irradiation becomes larger from top left toward bottom right.

FIG. 2C conceptually illustrates a state of in-plane distribution of the optical characteristics (the amount of phase shift) of the optical film 20 after the flash light irradiation under the above-mentioned conditions, in which the uniformity of the optical characteristics is achieved by the flash light irradiation under the above-mentioned conditions. Note that the stress in the optical film 20 is relieved by such flash light irradiation.

The present invention relieves the stress in the optical film 20, and enhances the uniformity of the optical characteristics, according to such a mechanism as described above.

That is, a method of manufacturing a photomask blank of the present invention includes using the quartz plate 70b on which the region 80 with a different transmittance to flash lamp light is formed, when the optical film 20 formed on the quartz substrate 10 transparent to exposure light is irradiated with the flash lamp light. The flash light with which the optical film 20 is irradiated has in-plane intensity distribution corresponding to the region 80 with a different transmittance formed on the quartz plate 70b, and hence the optical characteristics of the optical film 20 are uniformized in the same plane.

Meanwhile, even if the optical characteristics of the optical film after the film formation are uniform, in the case where the optical film is not irradiated with flash light for stress relief of the optical film at substantially uniform energy intensity, the in-plane uniformity of the optical film after the flash light irradiation is impaired.

Figure 3:
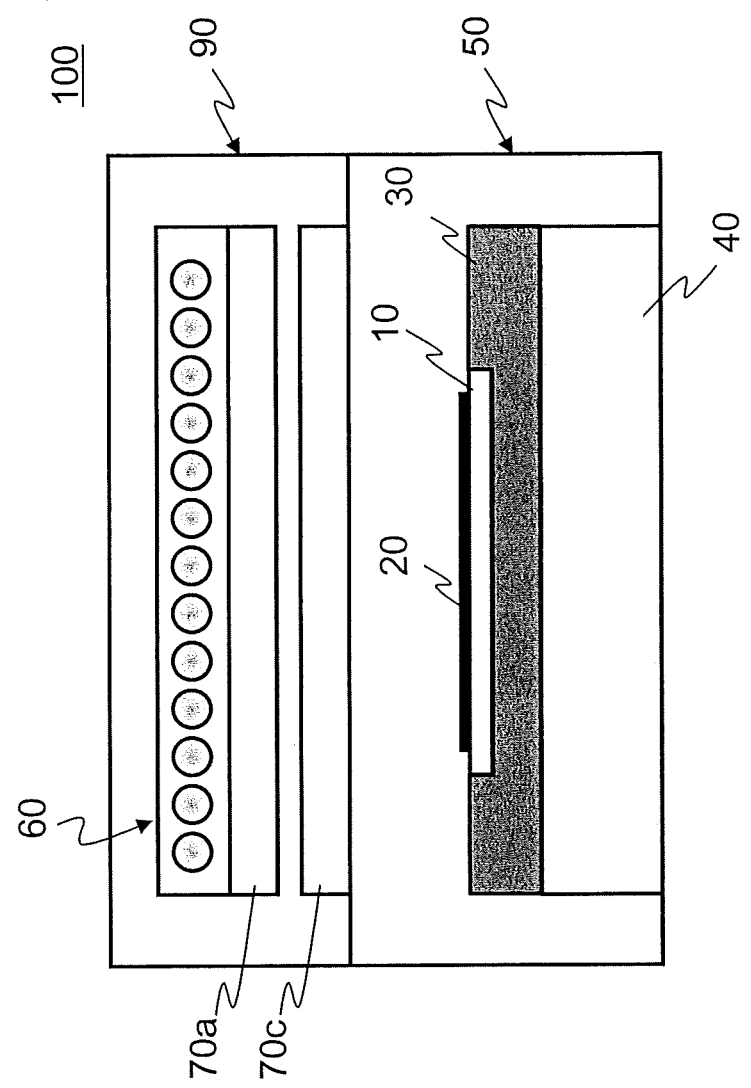
FIG. 3 is a view illustrating a configuration example of the flash light irradiation apparatus in the case of using a quartz plate on which a region with a different transmittance is not formed, in an irradiation system of flash lamp light illustrated in FIG. 1.

FIG. 3 is a view illustrating a configuration example of the flash light irradiation apparatus in the case of using a quartz plate 70c on which the region 80 with a different transmittance is not formed, in the irradiation system of the flash lamp light illustrated in FIG. 1.

Because both the quartz plates 70a and 70c are entirely transparent (each have a uniform transmittance), the amount of light with which the optical film 20 is irradiated is uniform in the irradiation plane.

Unfortunately, the in-plane uniformity of the characteristics of the optical film 20 may be rather impaired by such flash light irradiation.

The susceptor 30 is provided with a concave part, and the quartz substrate 10 is housed in this concave part.

Figure 4:
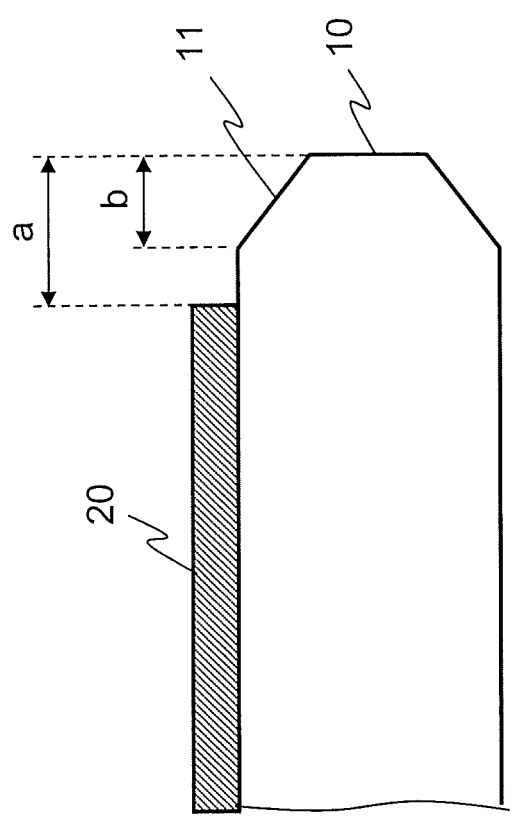
FIG. 4 is a view for describing a state of a peripheral edge part of a substrate having a main surface on which the optical film is formed.

FIG. 4 is a view for describing a state of a peripheral edge part of the substrate 10 in the state where the substrate 10 having the main surface on which the optical film 20 is formed is put on the susceptor 30 made of a material such as synthetic quartz glass. The substrate 10 is a substrate (transparent substrate) transparent to light used for exposure, and is also transparent to a reaching wavelength region 200 nm to 1,100 nm of the flash light. The substrate 10 has a square shape, is made of quartz (for example, synthetic quartz glass), and has an end part provided with a chamfered part 11 for the reason of crack prevention and other reasons. Note that the substrate 10 may be made of a material such as calcium fluoride.

In an example illustrated in FIG. 4, the optical film 20 is formed on the entire surface in a region that is inward by a distance a from an outer end part of the substrate 10. Further, the chamfered part 11 of the substrate 10 is formed inward from the outer end part at a width b of approximately 0.2 mm to 1 mm.

The optical film 20 is semi-transparent to the reaching wavelength region 200 nm to 1,100 nm of the flash light. In the case of a photomask, the transmittance of the optical film 20 to exposure light is preferably 5 to 15% and more preferably 5 to 10%.

If the transmittance to exposure light is higher than 15%, irradiation energy of flash light that is necessary to relieve the stress in the optical film 20 using the flash light is larger, and the process is complicated. On the other hand, if the transmittance to exposure light is lower than 5%, the optical film 20 excessively absorbs the flash light, and the film itself may be broken.

The optical film 20 is a film constituting a photomask, and is, for example, a halftone phase shift film. Examples of the halftone phase shift film include an amorphous silicon film and a metal compound film containing oxygen, nitrogen, and carbon. In particular, a halftone phase shift film formed by one or more layers each containing silicon, metal other than silicon, and one or more types selected from oxygen, nitrogen, and carbon is excellent in optical characteristic controllability.

Figure 5:
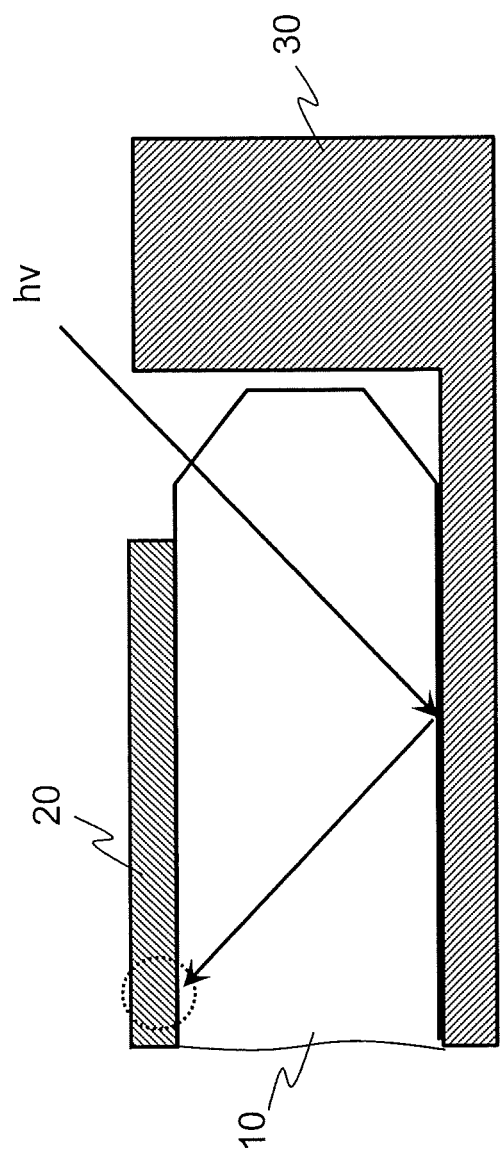
FIG. 5 is a view for describing a state of the peripheral edge part of the quartz substrate housed in a concave part provided to a susceptor.

FIG. 5 is a view for describing a state of the peripheral edge part of the quartz substrate 10 housed in the concave part provided to the susceptor 30.

As illustrated in FIG. 5, if flash light (hv) enters the quartz substrate 10 from the chamfered part 11, this light is reflected on the rear surface of the quartz substrate 10, and reaches the substrate front surface. The position at which the reflected light reaches the substrate front surface depends on the thickness of the quartz substrate 10. According to experiments carried out by the present inventors, in the case of a six-inch square substrate having a thickness of 0.25 inches, the reaching position corresponds to a position that is inward by approximately 16.5 mm from the substrate end part. Because the optical film 20 is formed at this position, a portion of the optical film 20 at this position is excessively irradiated with light from its rear side.

As illustrated in FIG. 5, the depth of a wall surface of the susceptor 30 is designed such that the main surface of the substrate 10 and the upper surface of the susceptor 30 are at the same height position. If the wall surface of the susceptor 30 is made higher than this design, the higher wall surface can prevent the light (hv) that obliquely enters the substrate from the chamfered part inside of the chamber, but shields even the flash light that directly enters the periphery of the optical film 20. Hence, optical characteristic distribution after the irradiation is not sufficient.

Figure 6:
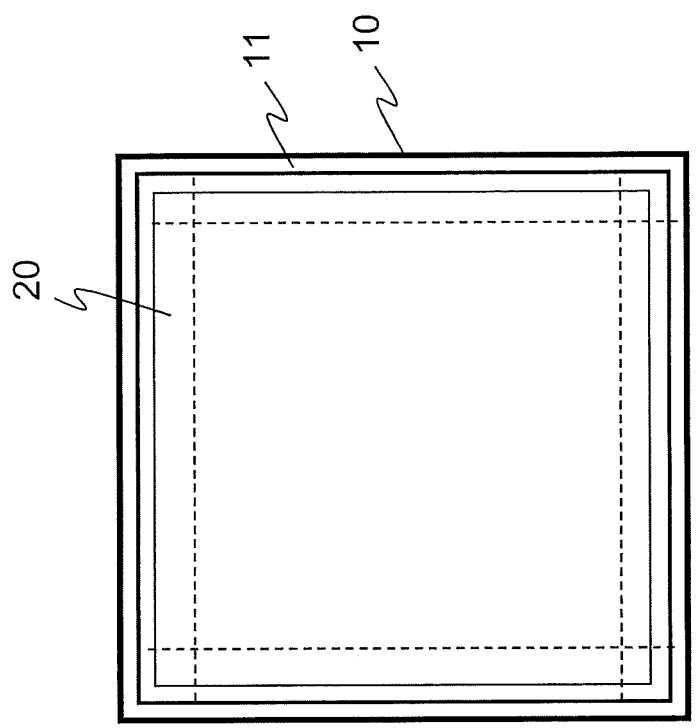
FIG. 6 is a view for describing an excessively irradiated region of the optical film.

FIG. 6 is a view for describing an excessively irradiated region of the optical film. Dotted lines in FIG. 6 correspond to the excessively irradiated region. The amount of irradiation is large in a region near the end part of the substrate 10. The amount of irradiation is particularly excessive at four corners corresponding to the intersection points of the dotted lines.

Figure 7:
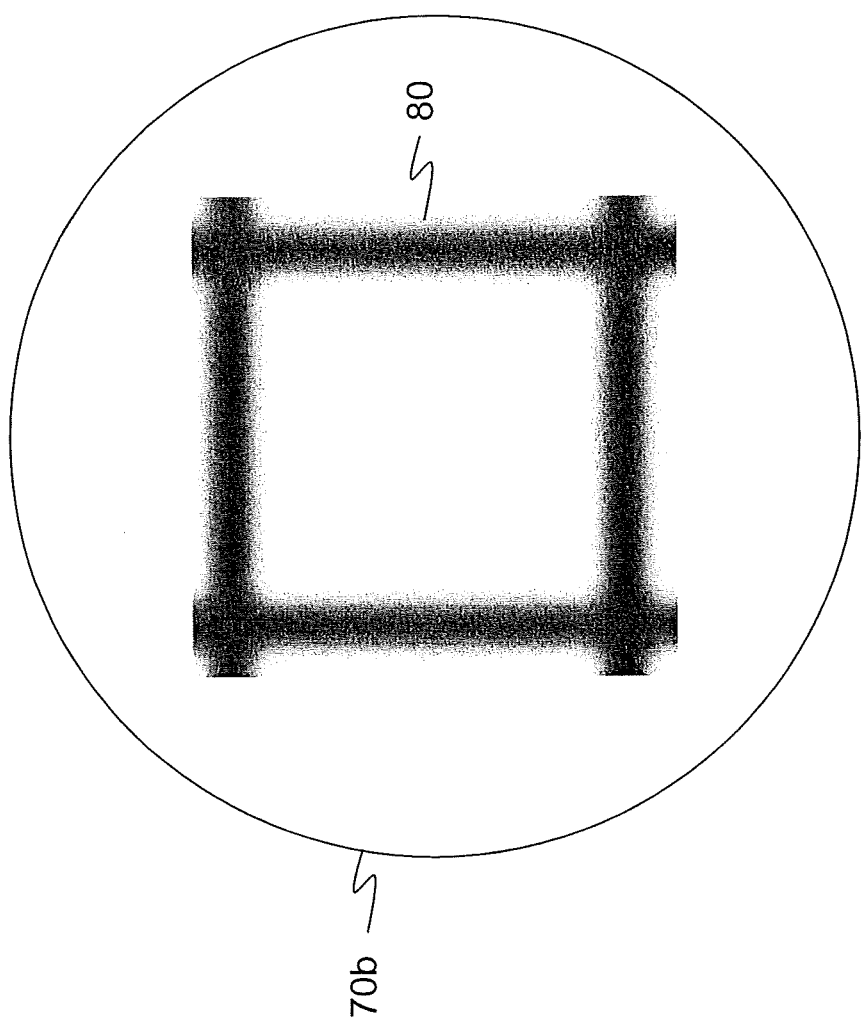
FIG. 7 is a view for describing, as an example, a region (transmittance adjustment region) with a different transmittance formed on a quartz plate illustrated in FIG. 1.

FIG. 7 is a view for describing, as an example, the region (transmittance adjustment region) 80 with a different transmittance formed on the quartz plate 70b illustrated in FIG. 1, in such a case.

The region 80 with a different transmittance is formed on the surface of the quartz plate 70b, and the region 80 makes the transmittance of flash light lower. Hence, the irradiation energy of the flash light that passes through the quartz plate 70b becomes lower in the outer end region of the optical film 20.

The optical film is irradiated with the flash light having such irradiation intensity distribution, whereby the optical film 20 can be irradiated with the flash light having substantially uniform intensity.

An appropriate amount of flash light irradiation depends on the film composition of the optical film 20. For example, in the case where the optical film 20 is a molybdenum-silicide-based phase shift film, the composition of this halftone phase shift film is different depending on for which exposure light this film is used as a photomask.

In general, KrF laser light, ArF laser light, and $F_2$ laser light are used as exposure light, and the transmittance required for a halftone phase shift film is higher in order of KrF, ArF, and $F_2$ in a wavelength range of 200 nm to 1,100 nm. Then, the light absorption efficiency is different depending on film properties of the halftone phase shift film, and hence the flash light irradiation energy also needs to be made higher in order of KrF, ArF, and $F_2$.

Specifically, with regard to a phase shift film having a transmittance of 5 to 7% to light (wavelength=248 nm) emitted from a KrF laser, the flash light irradiation energy is set to a predetermined amount of 21.5 $J/cm^2$ or less in terms of a measurement value by a calorimeter.

With regard to a phase shift film having a transmittance of 5 to 7% to light (wavelength=193 nm) emitted from an ArF laser, the flash light irradiation energy is set to a predetermined amount of 32.5 $J/cm^2$ or less.

With regard to a phase shift film having a transmittance of 5 to 7% to light (wavelength=157 nm) emitted from an $F_2$ laser, the flash light irradiation energy is set to a predetermined amount of 41.5 $J/cm^2$ or less.

If a halftone phase shift film that has been irradiated with flash light at an amount exceeding the appropriate amount is observed using a Nomarski microscope, breaks of the film are found near the intersection points of the dotted lines in FIG. 6, which is not preferable. In an example illustrated in FIG. 7, the region (transmittance adjustment region) 80 with a different transmittance is formed in order to avoid such an excessively irradiated part.

Note that both the stress relief of the optical film and the in-plane uniformity of the optical characteristics thereof can be achieved at the same time by appropriately adjusting the irradiation energy of the flash light.

The quartz plate 70b on which the region (transmittance adjustment region) 80 with a different transmittance to the flash lamp light is formed as described above can be made by, for example, forming a light shielding film at an appropriate thickness in a portion of a surface of a transparent quartz plate, the portion corresponding to the transmittance adjustment region. That is, the light shielding film is formed on the surface of the transparent quartz plate, and the thickness of the light shielding film is made different correspondingly to the region with a different transmittance.

For example, in the flash light irradiation system illustrated in FIG. 3, a light shielding film 20 is formed in advance on the quartz substrate 10. If the light shielding film 20 is irradiated with flash light, as described above, the flash light that enters the quartz substrate 10 from the chamfered part 11 is reflected on the rear surface of the quartz substrate 10, and reaches the substrate front surface, and a portion of the optical film 20 at the reaching position is excessively irradiated with light from its rear side. Accordingly, under favor of this phenomenon, the light shielding film 20 is partially sublimated by the energy of such excessive light irradiation, and is deposited onto the quartz plate 70c.

On this occasion, the film thickness of the light shielding film 20 and the irradiation intensity of the flash light are adjusted such that the sublimated light shielding film components are deposited at an appropriate amount onto the surface of the quartz plate 70c. As the film thickness of the light shielding film 20 formed on the quartz substrate 10 is larger, the amount of sublimation of the light shielding film 20 is larger, the amount of the light shielding film components deposited onto the quartz plate 70c is larger, and the degree of light shielding of the transmittance adjustment region 80 is higher.

Similarly, as the irradiation energy of the flash light is set to be higher, the amount of sublimation of the light shielding film 20 is larger, the amount of the light shielding film components deposited onto the quartz plate 70c is larger, and the degree of light shielding of the transmittance adjustment region 80 is higher.

That is, a light shielding film is formed on the entire surface of a quartz plate (quartz substrate). Then, the resultant quartz plate is irradiated with flash light having in-plane intensity distribution. The light shielding film is sublimated in accordance with the irradiation intensity of the flash light, to be thereby deposited onto another quartz plate. In this way, a light shielding film having a thickness that is different correspondingly to the region with a different transmittance is formed on the another quartz plate.

Here, it is preferable that the light shielding film components deposited onto the quartz plate 70c, namely, the light shielding film 20 formed on the quartz substrate 10 be an optical film used for a photomask blank, particularly, an optical film subjected to the flash light irradiation process for stress relief.

This is because, if the light shielding film 20 is an optical film used for a photomask blank, there is no concern about generation of contaminations at the time of the flash light irradiation for the stress relief and optical characteristic uniformization of the optical film.

Alternatively, the quartz plate 70b on which the region (transmittance adjustment region) 80 with a different transmittance to the flash lamp light is formed can also be made by, for example, roughening a portion of a surface of a transparent quartz plate, the portion corresponding to the transmittance adjustment region. That is, the surface roughness of the transparent quartz plate is made different correspondingly to the region with a different transmittance, using a technique such as sandblasting. According to such a method, there is no need for concern about an influence of the contaminations.

Note that, in the case of achieving the in-plane uniformization of the optical characteristics of the optical film and reliving the excessively irradiated region of the optical film at the same time, a quartz plate in which regions with different transmittances to flash lamp lights that respectively produce these effects are superimposed on each other may be used.

The optical film 20 does not need to be formed on the entire main surface of the transparent substrate 10. For example, in order to prevent the end surface of the optical film 20 from coming off when the optical film 20 is mechanically handled, the optical film 20 may not be formed from the outer end part of the substrate 10 up to the distance a as illustrated in FIG. 4.

The optical film 20 is, for example, a halftone phase shift film. In the case where the halftone phase shift film is a film formed by one or more layers each containing silicon, metal other than silicon, and one or more types selected from oxygen, nitrogen, and carbon, examples of the metal other than silicon can include W, Mo, Ti, Ta, Zr, Hf, Nb, V, Co, Cr, and Ni. In particular, a film containing Mo or a film having Mo as its chief component is preferable from the perspective of a reduction in warpage after flash light irradiation and an enhancement in resistance to chemicals.

Examples of the halftone phase shift film containing Mo include films made of molybdenum silicide oxide (MoSiO), molybdenum silicide nitride (MoSiN), molybdenum silicide carbide (MoSiC), molybdenum silicide oxide nitride (MoSiON), molybdenum silicide oxide carbide (MoSiOC), and molybdenum silicide oxide nitride carbide (MoSiONC). Such molybdenum-silicide-based phase shift films can be formed according to a reactive sputtering method using MoSi and the like as targets.

Further, two or more types of MoSi targets having different components may be sputtered at the same time, whereby halftone phase shift films having different compositions may be laminated in a multilayer manner. Such multilayer lamination can enhance the controllability of the optical characteristics.

The targets having different components are, for example, a combination of Mo targets and Si targets. In the case of using two or more types of targets, the area ratio of the targets is changed as needed, the respective electric powers of the targets are adjusted for each laminated layer, and a reactive gas is adjusted as appropriate, whereby a halftone phase shift film formed by a plurality of layers having different compositions can be obtained.

Note that it goes without saying that other optical films than the halftone phase shift film can also be formed according to a method similar to the above.

The energy (irradiation intensity) of the flash light irradiation for the stress relief and optical characteristic uniformization of the optical film is adjusted as appropriate depending on the degree of the in-plane uniformity of the optical characteristics of the optical film 20 after the film formation. In the case where the optical characteristics of the optical film 20 after the film formation have in-plane distribution, the optical film 20 is irradiated with flash light having such irradiation intensity distribution that cancels the in-plane distribution, whereby the in-plane distribution of the characteristics of the optical film 20 after the irradiation is reduced.

On the other hand, in the case where the in-plane uniformity of the optical characteristics of the optical film 20 after the film formation is sufficiently high, the optical film 20 may be irradiated with flash light having approximately uniform irradiation intensity distribution.

Note that optical films (other optical films) (such as a light shielding film, an antireflective film, and a phase shift film) different from the optical film 20 and functional films (such as an etching stopper film and an etching mask film) are laminated as needed on the optical film 20 after the flash lamp light irradiation, whereby a photomask blank is manufactured.

These films can be combined with each other depending on the intended use. Further, the functional films may also be provided with functions of the optical films.

According to such a method as described above, the photomask blank of the present invention can be obtained.

EXAMPLE

First, in the flash light irradiation system illustrated in FIG. 3, a chromium nitride oxide film 20 having a function of a light shielding film in a photomask blank was formed as the optical film 20 at a thickness of 50 nm, on the main surface of the six-inch square quartz substrate 10 having a thickness of 0.25 inches.

Subsequently, the chromium nitride oxide film 20 formed on the quartz substrate 10 was irradiated with flash light from the flash lamp 60. The irradiation energy at that time was 25.0 J/cm$^2$.

The chromium nitride oxide film 20 was partially sublimated by the flash light irradiation, and was deposited onto the transparent quartz plate 70c. This was used as the quartz plate 70b described above.

The halftone phase shift film 20 as an optical film made of MoSiON was formed up to a film thickness of 760 Å according to reactive DC sputtering, on the main surface of the six-inch square quartz substrate 10 having a thickness of 0.25 inches, whereby a photomask blank intermediate was formed. Note that the phase difference of the halftone phase shift film 20 from exposure light of an ArF excimer laser (193 nm) was about 180°, the transmittance thereof to this exposure light was about 5%, and the in-plane distribution thereof before the flash light irradiation was sufficiently low.

With the use of the flash light irradiation apparatus 100 illustrated in FIG. 1, the substrate 10 on which the halftone phase shift film 20 was formed as described above was put on the susceptor 30, and was heated to 80° C. In this state, the substrate 10 was irradiated with xenon flash lamp light through the quartz plates 70a and 70b.

Note that, for comparison, another sample was also made under the same conditions as the above except that the substrate 10 was irradiated with xenon flash lamp light through the quartz plates 70a and 70c.

Figure 8:
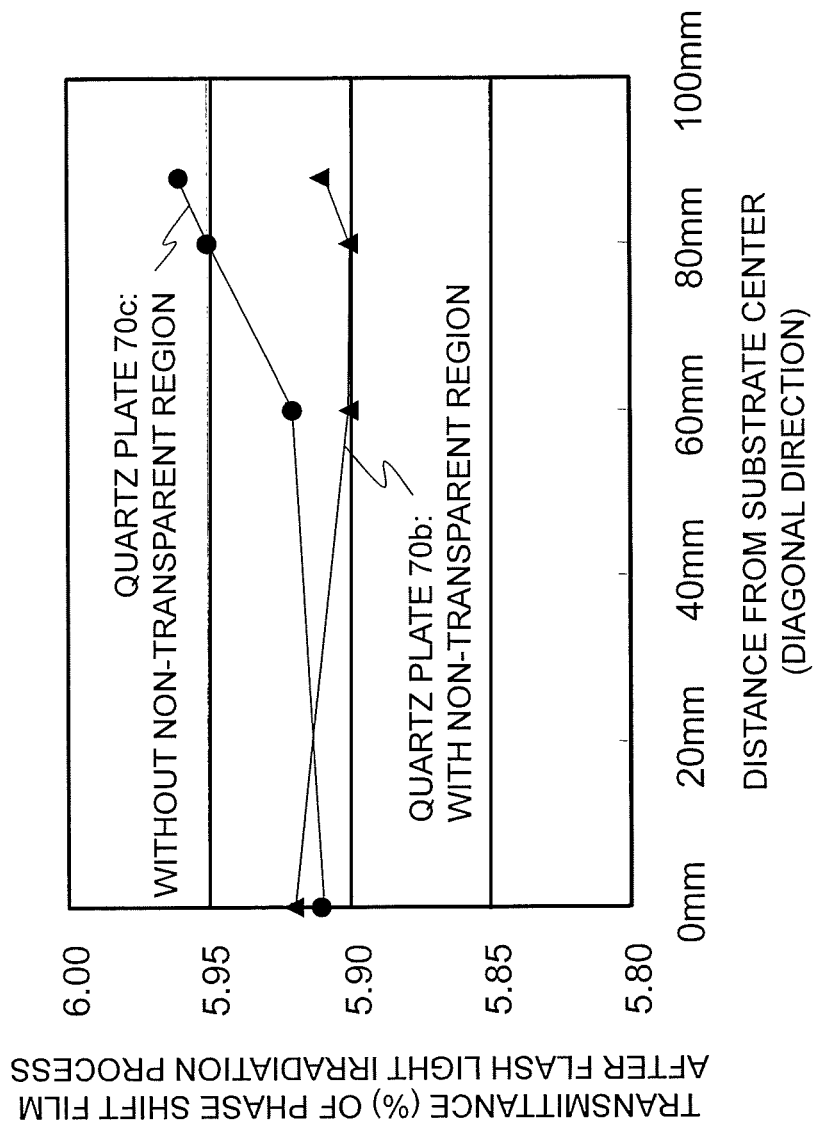
FIG. 8 is a graph showing results obtained by examining a relation between: the transmittance of a halftone phase shift film that is irradiated with flash light from a xenon flash lamp, using the flash light irradiation apparatus according to the present invention; and a distance from a substrate center (diagonal direction).

FIG. 8 is a graph showing results obtained by examining a relation between: the transmittance of the halftone phase shift film irradiated with the flash light from the xenon flash lamp; and the distance from the substrate center (diagonal direction)

FIG. 8 shows: results (Example) in the case of using the quartz plate 70b including a non-transparent region formed as the region with a different transmittance to the flash lamp light; and results (Comparative Example) in the case of using the quartz plate 70c having a uniform transmittance to the flash lamp light (being entirely transparent).

In the case of using the quartz plate adopted in the present invention, namely, the quartz plate 70b including the region with a different transmittance to the flash lamp light, the difference between the maximum value and the minimum value of the transmittance of the halftone phase shift film after the flash light irradiation process in the substrate plane is as small as 0.02%. That is, this case exhibits high in-plane uniformity.

In contrast, in the case of using the quartz plate 70c having a uniform transmittance to the flash lamp light (being entirely transparent), the difference between the maximum value and the minimum value of the transmittance is 0.05%, which is 2.5 times the value of Example.

That is, according to the present invention, it is possible to achieve not only the stress relief of the optical film but also the high in-plane uniformity of the optical characteristics thereof at the same time through the flash light irradiation.

The present invention provides a technique for enhancing the in-plane uniformity of characteristics of an optical film constituting a photomask blank.

What is claimed is:

1. A method of manufacturing a photomask blank, comprising:
    forming an optical film on a quartz substrate transparent to exposure light; and
    irradiating said optical film with flash lamp light, wherein said optical film is irradiated with the flash lamp light through a quartz plate on which a region with a different transmittance to the flash lamp light is formed, and wherein
    the flash light irradiation energy is set to a predetermined amount of 41.5 J/cm² or less.

2. The method of manufacturing a photomask blank according to claim 1, further comprising laminating one or more films on said optical film after the flash lamp light irradiation.

3. The method of manufacturing a photomask blank according to claim 2, wherein said one or more films are selected from other optical films different from the optical film and functional films.

4. The method of manufacturing a photomask blank according to claim 1, wherein
    said quartz plate includes a light shielding film on a surface thereof, and
    said light shielding film has a thickness that is different correspondingly to the region with a different transmittance.

5. The method of manufacturing a photomask blank according to claim 4, further comprising laminating one or more films on said optical film after the flash lamp light irradiation.

6. The method of manufacturing a photomask blank according to claim 5, wherein said one or more films are selected from other optical films different from the optical film and functional films.

7. The method of manufacturing a photomask blank according to claim 4, wherein said irradiating said optical film includes a sub-step of forming the light shielding film having the thickness that is different correspondingly to the region with a different transmittance, on a transparent quartz plate, by:
    forming a light shielding film on an entire surface of a second quartz plate;
    then irradiating the second quartz plate with flash light having in-plane intensity distribution; and
    sublimating the light shielding film in accordance with irradiation intensity of the flash light, to thereby deposit the sublimated light shielding film onto the transparent quartz plate.

8. The method of manufacturing a photomask blank according to claim 7, further comprising laminating one or more films on said optical film after the flash lamp light irradiation.

9. The method of manufacturing a photomask blank according to claim 8, wherein said one or more films are selected from other optical films different from the optical film and functional films.

10. The method of manufacturing a photomask blank according to claim 4, wherein said quartz plate is formed by: irradiating a substrate on which a light shielding film is formed, with flash light; and sublimating the light shielding film, to thereby deposit the sublimated light shielding film onto a transparent quartz plate.

11. The method of manufacturing a photomask blank according to claim 10, further comprising laminating one or more films on said optical film after the flash lamp light irradiation.

12. The method of manufacturing a photomask blank according to claim 11, wherein said one or more films are selected from other optical films different from the optical film and functional films.

13. The method of manufacturing a photomask blank according to claim 1, wherein said quartz plate has a surface roughness that is different correspondingly to the region with a different transmittance.

14. The method of manufacturing a photomask blank according to claim 13, further comprising laminating one or more films on said optical film after the flash lamp light irradiation.

15. The method of manufacturing a photomask blank according to claim 14, wherein said one or more films are selected from other optical films different from the optical film and functional films.

16. The method of manufacturing a photomask blank according to claim 1, wherein said optical film is a halftone phase shift film.

17. A photomask blank manufactured using the method according to claim 1.

* * * * *